United States Patent
Nagashima

(10) Patent No.: US 6,716,743 B2
(45) Date of Patent: Apr. 6, 2004

(54) METHOD OF MANUFACTURING A SEMICONDUCTOR DEVICE

(75) Inventor: Naoki Nagashima, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/157,402

(22) Filed: May 29, 2002

(65) Prior Publication Data

US 2003/0022482 A1 Jan. 30, 2003

(30) Foreign Application Priority Data

May 31, 2001 (JP) .................................. P2001-164672

(51) Int. Cl.[7] .......................................... H01L 21/4763
(52) U.S. Cl. ....................... 438/626; 438/627; 438/629; 438/631; 438/633; 438/643; 438/645; 438/648; 438/653; 438/656; 438/672; 438/685; 438/687; 438/688; 438/692; 438/693; 438/700
(58) Field of Search ................................ 438/626, 627, 438/631, 633, 643, 645, 648, 653, 656, 672, 685, 687, 692, 693, 700, 629, 688

(56) References Cited

U.S. PATENT DOCUMENTS

| | | | | |
|---|---|---|---|---|
| 5,451,551 A | * | 9/1995 | Krishnan et al. | 437/241 |
| 6,051,496 A | * | 4/2000 | Jang | 438/687 |
| 6,069,082 A | * | 5/2000 | Wong et al. | 438/692 |
| 6,103,625 A | * | 8/2000 | Marcyk et al. | 438/691 |
| 6,114,246 A | * | 9/2000 | Weling | 438/691 |
| 6,242,805 B1 | * | 6/2001 | Weling | 438/690 |
| 6,391,780 B1 | * | 5/2002 | Shih et al. | 438/692 |
| 6,417,093 B1 | * | 7/2002 | Xie et al. | 438/626 |
| 2002/0098675 A1 | * | 7/2002 | Lin | 438/687 |

* cited by examiner

Primary Examiner—Lynne Gurley
(74) Attorney, Agent, or Firm—Sonnenschein, Nath & Rosenthal LLP

(57) ABSTRACT

A method of forming wiring of a uniform film thickness using a damascene process is proposed. Tantalum nitride, copper, another copper, and another tantalum nitride, for example, all constituting conductive films of different polishing rates, are overlayed on the top layer of an insulating film in which one wiring groove and another wiring groove are formed. The film thickness of the tantalum nitride, the copper, the other copper, and the other tantalum nitride is set and formed so that the height of the surface of the tantalum nitride formed on a silicon oxide film excluding the one wiring groove matches the height of the surface of the other tantalum nitride formed on the top layer of the one wiring groove. Subsequently, polishing takes over to complete the forming process.

10 Claims, 2 Drawing Sheets

METHOD OF MANUFACTURING A SEMICONDUCTOR DEVICE

CROSS REFERENCE TO RELATED APPLICATIONS

This application claims priority to Japanese Patent Application No. JP 2001-164672, filed on May 31, 2001, the disclosure of such application being herein incorporated by reference to the extent permitted by law.

BACKGROUND OF THE INVENTION

1. Field of the Invention

The present invention relates to a method of manufacturing a semiconductor device and, more particularly, to a method of manufacturing a semiconductor device having wiring formed thereon.

2. Description of the Related Art

With miniaturization of integrated circuits for semiconductors, the minimum line width and the minimum spacing of wiring of element connection wirings have become narrower than before. If current density of wiring increases with further miniaturization of wiring, atomic migration may occur in the wiring material due to electric charge moving at high speed, so that breaking of the wiring, high resistance of the wiring and the like may possibly occur. Consequently, the wiring thickness cannot be made thinner to suppress an increase in current density, thus causing such problems as faulty processing of wiring as a result of an increase in the wiring aspect ratio and an increase in parasitic capacity due to a decrease in wiring spacing.

In order to alleviate these problems, it is considered to take such steps as changing from conventional aluminum to copper as a wiring material, reducing a wiring resistance, and improving migration-resistance properties.

In addition, with regard to a method of forming wiring, it is proposed to employ a damascene method in which a wiring groove is hollowed out in an insulating film so as to embed the wiring itself in the insulating film to reduce faulty processing of wiring and a parasitic capacity due to reduction of the wiring spacing.

The damascene method is a method of forming wiring by hollowing out a wiring groove in an insulating film and embedding the wiring itself in the insulating film.

FIG. 2 schematically illustrates a conventional process of forming connection wiring: FIG. 2A showing a wiring groove forming process; FIG. 2B showing a wiring material layer forming process; FIG. 2C showing a polishing process; and FIG. 2D showing a copper wiring forming process.

As for the process of FIG. 2A, after an element (not illustrated) is formed on a silicon substrate, silicon oxide films 11 and 12 which are insulating films are formed in sequence, and a photo resist is coated on the films, whereafter an aperture is made by photolithography at a photo resist portion which becomes wiring, thus forming a photo resist pattern. Next, using the photo resist pattern as a mask, the silicon oxide film 12 is subjected to anisotropic etching, thereby forming a wiring groove 13a of a wide line width and a wiring groove 13b of a narrow line width on the silicon oxide film 12 and forming a conductor pattern.

As for the process of FIG. 2B, after forming tantalum nitride 14 as a first barrier metal layer on the conductor pattern, copper 15 is formed as a wiring material layer. At this event, the copper 15 formed on recesses of the conductor pattern has its height of the surface formed lower than other portions.

As for the process of FIG. 2C, the copper 15 is polished until the nitride tantalum 14 is exposed.

As for the process of FIG. 2D, the tantalum nitride 14 and the copper 15 are polished until the silicon oxide film 12 is exposed, so that copper wiring is formed in the wiring grooves 13a and 13b.

However, the height of the surface of the copper 15 formed on the wiring groove 13a on its wider line width is formed lower than other portions, and further, a condition of polishing the copper 15 is such that a polishing rate of the tantalum nitride 14 is slower than a polishing rate of the copper 15, wherefore after the tantalum nitride 14 is exposed, a phenomenon called "dishing" occurs due to the elasticity of a polishing cloth. As a result, as for the copper 15 formed in the wiring groove 13a, polishing proceeds from the surface of the exposed silicon oxide film 12 to the inside to cause the wiring film thickness to be reduced. Consequently, there may occur problems such as an increase in wiring resistance and degradation of flatness or smoothness.

SUMMARY OF THE INVENTION

The present invention has been conceived in view of the aforementioned problems in the prior art and it is preferable according to a preferred embodiment of the present invention to provide a manufacturing method for a semiconductor device which forms wiring having uniform film thickness.

According to a preferred embodiment of the present invention, there is provided a manufacturing method for a semiconductor device under which wiring is formed. The method includes forming wiring grooves in an insulating film to form a conductor pattern, forming a first barrier metal layer and a wiring material layer on the conductor pattern, forming a second barrier metal layer so that a height of the surface of the first barrier metal layer on protuberances of the conductor pattern is equal to a height of the surface of the second barrier metal on recesses of the conductor pattern, removing the second barrier metal layer on the protuberances of the conductor pattern, removing the wiring material layer on the protuberances of the conductor pattern, and removing the first barrier metal layer on the protuberances thereof and the second barrier metal layer on the recesses thereof.

In a construction described above, the wiring grooves are formed in the insulating film to form the conductor pattern, the first barrier metal layer and the wiring material layer being formed on the conductor pattern, the second barrier metal layer is formed to make the height of the surface of the first barrier metal layer on the protuberances of the conductor pattern equal to the height of the surface of the second barrier metal layer on the recesses of the conductor pattern, so that when the second barrier metal layer and the wiring material layer are removed until the first barrier metal layer is exposed, the wiring material layer in the wiring grooves is protected by the second barrier metal layer on the recesses of the conductor pattern, thus assuring the wiring material layer in the wiring grooves is not removed deeper than the surface of the insulating film and no decrease of the wiring film thickness is caused.

BRIEF DESCRIPTION OF THE DRAWINGS

The above and other objects, features and advantages of the present invention will become more apparent to those skilled in the art from the following description of the presently preferred exemplary embodiments of the invention taken in conjunction with the accompanying drawings, in which:

FIGS. 1A to 1D are schematic diagrams illustrating a process of forming connection wiring according to a preferred embodiment of the present invention, in which: FIG. 1A shows a wiring groove forming process; FIG. 1B shows a wiring material layer forming process; FIG. 1C shows a polishing process; and FIG. 1D shows a copper wiring forming process; and FIGS. 2A to 2D are schematic diagrams illustrating a conventional process of forming connection wiring, in which: FIG. 1A shows a wiring groove forming process; FIG. 1B shows a wiring material layer forming process; FIG. 1C shows a polishing process; and FIG. 1D shows a copper wiring forming process.

DETAILED DESCRIPTION OF THE PREFERRED EMBODIMENTS OF THE INVENTION

A preferred embodiment of the present invention is now described below with reference to the accompanying drawings.

FIGS. 1A to 1D are schematic diagrams illustrating a process of forming connection wiring according to a preferred embodiment of the present invention.

Figure 1A:
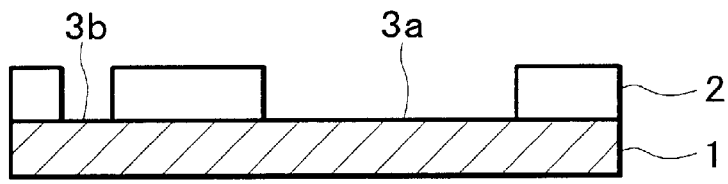

As for the process of FIG. 1A, after an element (not illustrated) is formed on a silicon substrate, a silicon oxide film 1 which is an insulating film is formed in a thickness of 700 nm, and a silicon oxide film 2 is formed on a surface of the silicon oxide film 1 in a thickness of 300 nm, whereafter a photo resist is coated on the silicon oxide film 2. Next, photolithography is used to form a photo resist pattern by producing an aperture at a portion of the photo resist which is to become wiring, whereas anisotropic etching of the silicon oxide film 2 is conducted with this photo resist pattern as a mask to form a conductor pattern by forming on the silicon oxide film 2 a wiring groove 3a of a wide line width and a wiring groove 3b of a narrow line width, both at a depth of 300 nm.

Figure 1B:
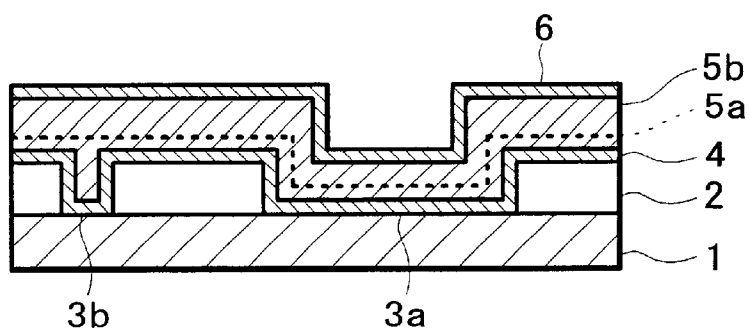

As for the process of FIG. 1B, after forming tantalum nitride 4 by sputtering on the conductor pattern as a first barrier metal layer having a thickness of 15 nm, copper 5a is formed by sputtering on a surface of the tantalum nitride 4 as a wiring material layer in a thickness of 20 nm. Further, copper 5b is formed by electrolytic plating on a surface of the copper 5a as a wiring material layer in a thickness of 265 nm. This is followed by a step of forming tantalum nitride 6 on a surface of the copper 5b as a second barrier metal layer in a thickness of 20 nm. At this event, the copper 5b and the tantalum nitride 6 at recesses of the conductor pattern are so formed that their height at the surface of the recesses is lower than at other portions of the surface of the conductor pattern. Moreover, the height of the surface of the tantalum nitride 4 on protuberances of the conductor pattern is formed so as to be on the same height of the surface of the tantalum nitride 6 at the recessed portions.

Figure 1C:
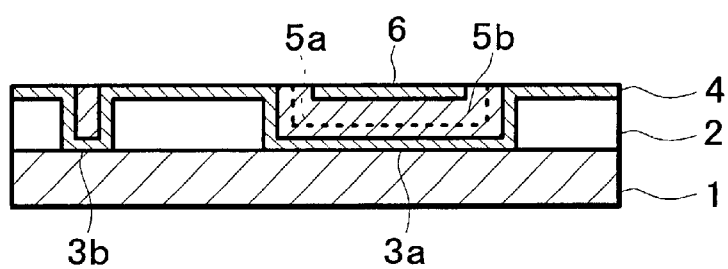

As for the process of FIG. 1C, first, the tantalum nitride 6 on the protuberances of the conductive pattern is subjected to polishing and, when the tantalum nitride 6 is removed, polishing is stopped. For polishing, a polishing pad IC1000 (produced by Rodel, Inc.) is used, and as a polishing agent there is employed a mixed solution of alumina polish powder and hydrogen peroxide, in which, for example, a mixed solution with a hydrogen peroxide content of 20% by weight is used, whereupon polishing is performed at a pressure of 140 g/cm².

Next, under a condition of polishing rates of copper 5a and copper 5b being relatively faster than with respect to the tantalum nitride 4 and the tantalum nitride 6, polishing of the tantalum nitride 6, the copper 5b and the copper 5a is performed, and when the tantalum nitride 4 is exposed, polishing is stopped.

For polishing, the polishing pad IC1000 of Rodel, Inc. is used and, as the polishing agent, there is employed the mixed solution of alumina polish powder and hydrogen peroxide, in which, for example, a mixed solution with a hydrogen peroxide content of 30% by weight is used, whereupon polishing is performed at a pressure of 250 g/cm².

At this event, even when polishing of the copper 5a and the copper 5b at the protuberances of the conductive pattern is completed, since the polishing rate of the nitride tantalum 6 is slow at the recess of the conductor pattern, polishing of the copper 5a and the copper 5b inside the recess does not proceed and dishing does not occur.

Figure 1D:
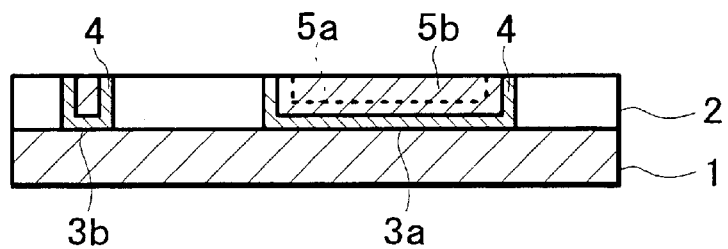
Figure 2A:
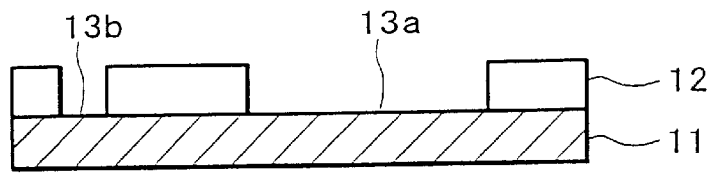
Figure 2B:
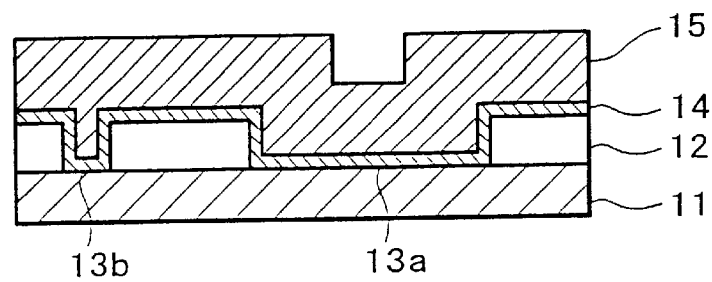
Figure 2C:
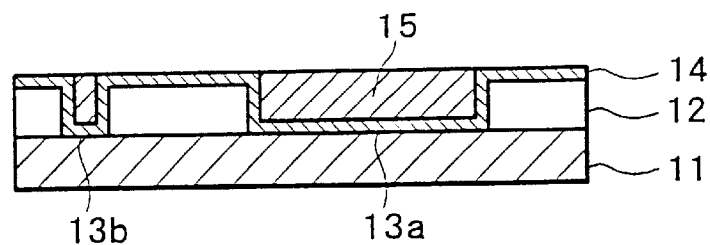
Figure 2D:
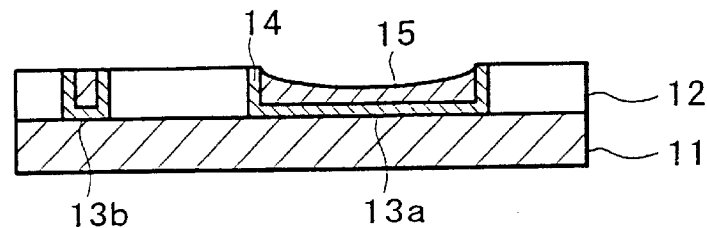

In the process of FIG. 1D, under the condition of the polishing rates of the tantalum nitride 4 and the tantalum nitride 6 being relative faster with respect to the copper 5a and the copper 5b, the tantalum nitride 4 on the protuberances of the conductor pattern and the tantalum nitride 6 on the recesses of the conductor pattern are polished and removed until the silicon oxide film 2 is exposed, and copper wiring is formed in the wiring groove 3a and the wiring groove 3b. For polishing, the polishing pad IC1000 of Rodel, Inc. is used and, as the polishing agent, there is employed the mixed solution of alumina polish powder and hydrogen peroxide, in which, for example, a mixed solution with a hydrogen peroxide content of 20% by weight is used, whereupon polishing is performed at a pressure of 250 g/cm².

In addition, although polishing in the process of FIG. 1D being set under the conditions of the polishing rates of the tantalum nitride 4 and the tantalum nitride 6 being relatively faster with respect to the copper 5a and the copper 5b, after the process of FIG. 1C, it is possible to continue to carry out polishing under the condition of the polishing rates of the copper 5a and the copper 5b being relatively faster with respect to the tantalum nitride 4 and the tantalum nitride 6.

As described above, by overlaying the tantalum nitride 4, the copper 5a, the copper 5b, and the tantalum nitride 6 on the conductor pattern, by setting and forming the film thickness of the tantalum nitride 4, the copper 5a, the copper 5b, and the tantalum nitride 6 so that the height of the surface of the tantalum nitride 4 on the protuberances of the conductor pattern is equal to the height of the surface of the tantalum nitride 6 on the recesses of the conductor pattern on the surface of the copper 5b, and, by polishing under an appropriate polishing condition, it is possible to form copper wiring of a uniform film thickness without causing a decrease in the film thickness in the wiring groove 3a due to dishing of the copper 5a and the copper 5b.

According to the foregoing description, a single layer silicon oxide film is used as an insulating film. However, different materials may be used for the silicon oxide film, and a multi-layered structure may also be employed.

Further, the description mentioned above addresses a case of combining tantalum nitride and copper for used in the barrier metal layer and the wiring material layer. Nevertheless, there are other possible cases, for example, using refractory nitride metals including titanium nitride and tungsten nitride for the first barrier metal layer and the second barrier metal layer, in addition to tantalum nitride. For the wiring material layer, utilization of low electric resistance metals such as aluminum in addition to copper can be considered. It should be noted that it is possible to make a proper change of the polishing condition through combinations of these materials.

Furthermore, although description thus far presented is limited to the formation of wiring, it is an advantage of the present invention that it is applicable to a dual damascene method, in which, after the formation of both the wiring grooves and the connecting apertures, conductive films of differing polishing rates are formed and polished.

Since the preferred embodiments of present invention perform formation by overlaying conductive films of varying polishing rates, setting and forming the film thickness of each conductive film, it is a feature and advantage of the preferred embodiment of present invention to provide the conductive film in the wiring grooves protected by the conductive film of the upper layer of the wiring grooves, so that when polishing, there occurs no decrease in the wiring film thickness in the wiring grooves due to dishing, thus enabling wiring to be formed in a uniform film thickness.

In this manner, the preferred embodiments of the present invention presented herein may make it possible to form wiring of a wide line width as well as a pad, further contributing to improving an increased convenience of designing circuitry and avoiding problems such as delay due to increase of wiring resistance.

Although the invention having been described in its preferred form with a certain degree of particularity, other changes, variations, combinations and sub-combinations are possible therein. It is therefore to be understood that any modifications will be practiced otherwise than as specifically described herein without departing from the scope and spirit of the present invention.

What is claimed is:

1. A method of manufacturing a semiconductor device having wiring formed thereon, said method comprising:
   forming a conductor pattern having narrow and wide protuberances and recesses, by forming wiring grooves on an insulating film;
   forming a first barrier metal layer and then a wiring material layer on said conductor pattern wherein said wiring material layer comprises a first layer and a second layer;
   forming a second barrier metal layer on said wiring material so that a height of a surface of said first barrier metal layer at protuberances of said conductor pattern is made equal to a height of a surface of said second barrier metal layer at recesses of said conductor pattern;
   removing said second barrier metal layer at the protuberances of said conductor pattern;
   removing said wiring material layer at the protuberances of said conductor pattern; and
   removing said first barrier metal layer at the protuberances of said conductor pattern and said second barrier metal layer at the recesses of said conductor pattern.

2. The method of manufacturing a semiconductor device according to claim 1, further comprising:
   removing said second barrier metal layer at the protuberances of said conductor pattern by polishing;
   removing said wiring material layer at the protuberances of said conductor pattern by polishing under a polishing condition of a faster polishing rate of said wiring material layer than a polishing rate of said second barrier metal layer; and
   removing said first barrier metal layer at the protuberances of said conductor pattern and said second barrier metal layer at the recesses of said conductor pattern by polishing under a polishing condition of faster polishing rates of said first barrier metal layer and said second barrier metal layer than the polishing rate of said wiring material layer.

3. The method of manufacturing a semiconductor device according to claim 1, further comprising:
   removing said second barrier metal layer at the protuberances of said conductor pattern by polishing;
   removing said wiring material layer at the protuberances of said conductor pattern under a polishing condition of a faster polishing rate of said wiring material layer than the polishing rate of said second barrier metal layer; and
   removing said first barrier metal layer at the protuberances of said conductor pattern and said second barrier metal layer at the recesses of said conductor pattern by polishing.

4. The method of manufacturing a semiconductor device according to claim 1, wherein said insulating film forming said conductor pattern comprises a multi-layer structure.

5. The method of manufacturing a semiconductor device according to claim 1, wherein said conductor pattern comprises said wiring grooves and connecting apertures.

6. The method of manufacturing a semiconductor device according to claim 1, wherein the material of said first barrier metal layer comprises one of tantalum nitride, titanium nitride, and tungsten nitride.

7. The method of manufacturing a semiconductor device according to claim 1, wherein the material of said wiring material layer comprises one of copper and aluminum.

8. The method of manufacturing a semiconductor device according to claim 1, wherein the material of said second barrier metal layer comprises one of tantalum nitride, titanium nitride, and tungsten nitride.

9. The method of manufacturing a semiconductor device according to claim 1, wherein said wiring material comprises a first layer deposited by sputtering and a second layer deposited by elecrolytic plating.

10. A method of manufacturing a semiconductor device having wiring formed thereon, said method comprising:
    forming a conductor pattern having narrow and wide protuberances and recesses, by forming wiring grooves on an insulating film;
    forming a first barrier metal layer and then a wiring material layer on said conductor pattern wherein said wiring material layer comprises a first layer and a second layer;
    forming a second barrier metal layer on said wiring material so that a height of a surface of said first barrier metal layer at protuberances of said conductor pattern is made equal to a height of a surface of said second barrier metal layer at recesses of said conductor pattern;
    removing said second barrier metal layer at the protuberances of said conductor pattern;
    removing said wiring material layer at the protuberances of said conductor pattern to expose said surface of said first barrier metal layer and said surface of said second barrier metal layer at said recesses of said conductor pattern;
    wherein a height of said exposed surface of said first barrier metal layer at said protuberances of said conductor pattern is equal to said height of said exposed surface of said second barrier metal layer at said recesses of said conductor pattern; and
    removing said first barrier metal layer at said protuberances of said conductor pattern and said second barrier metal layer at said recesses of said conductor pattern.

* * * * *